(12) United States Patent
Moon et al.

(10) Patent No.: US 10,861,925 B2
(45) Date of Patent: Dec. 8, 2020

(54) DISPLAY APPARATUS

(71) Applicant: SAMSUNG DISPLAY CO., LTD., Yongin-si (KR)

(72) Inventors: Joongsoo Moon, Yongin-si (KR); Kwangmin Kim, Yongin-si (KR); Yangwan Kim, Yongin-si (KR); Cheolgon Lee, Yongin-si (KR); Youngjin Cho, Yongin-si (KR); Changkyu Jin, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 16/264,231

(22) Filed: Jan. 31, 2019

(65) Prior Publication Data

US 2019/0267444 A1  Aug. 29, 2019

(30) Foreign Application Priority Data

Feb. 27, 2018  (KR) .................. 10-2018-0023900

(51) Int. Cl.
*H01L 27/32* (2006.01)
*H01L 51/00* (2006.01)
(Continued)

(52) U.S. Cl.
CPC ...... *H01L 27/3276* (2013.01); *H01L 27/3258* (2013.01); *H01L 27/3272* (2013.01);
(Continued)

(58) Field of Classification Search
CPC ............. H01L 27/3276; H01L 51/5281; H01L 51/0097; H01L 27/3272; H01L 27/3258;
(Continued)

(56) References Cited

U.S. PATENT DOCUMENTS 8,829,495 B2  9/2014 Kim et al.
9,293,738 B2  3/2016 Park et al.
(Continued)

FOREIGN PATENT DOCUMENTS

EP          3 226 300       10/2017
KR    10-2015-0108469 A     9/2015
(Continued)

OTHER PUBLICATIONS

The extended European Search Report corresponding to European Patent Application No. 19157060.5 dated Jul. 15, 2019.

*Primary Examiner* — Patricia D Reddington
(74) *Attorney, Agent, or Firm* — Kile Park Reed & Houtteman PLLC

(57) ABSTRACT

A display apparatus includes a substrate having a display area and a peripheral area, wirings over the peripheral area that extend in a first through third areas, an interval between the wirings in the second area is greater than an interval between the wirings in each of the first and third areas, an insulating layer covering the wirings and having a first uneven surface corresponding to the wirings, a first conductive layer over the insulating layer and including a second uneven surface corresponding to the first uneven surface, a flat planarization layer over the first conductive layer and exposing at least a portion of the first conductive layer, a second conductive layer electrically connected to the first conductive layer, at least a portion of the second conductive layer is over the planarization layer, and a polarization plate on the second conductive layer.

25 Claims, 12 Drawing Sheets

(51) Int. Cl.
*H01L 51/52* (2006.01)
*H01L 27/12* (2006.01)

(52) U.S. Cl.
CPC ...... *H01L 51/0097* (2013.01); *H01L 51/5281* (2013.01); *H01L 27/124* (2013.01); *H01L 51/5256* (2013.01); *H01L 2251/5338* (2013.01); *H01L 2251/5392* (2013.01)

(58) Field of Classification Search
CPC ..... H01L 2251/5392; H01L 2251/5338; H01L 27/124; H01L 51/5256
See application file for complete search history.

(56) References Cited

U.S. PATENT DOCUMENTS

| | | |
|---|---|---|
| 9,634,035 B2 | 4/2017 | An et al. |
| 10,083,992 B2 | 9/2018 | Go et al. |
| 2012/0080664 A1 | 4/2012 | Kim et al. |
| 2013/0293236 A1* | 11/2013 | Lee ................... G09G 3/3233 324/414 |
| 2014/0145979 A1* | 5/2014 | Lee ................... G06F 3/0412 345/173 |
| 2016/0343792 A1* | 11/2016 | Jang .................. H01L 27/3276 |
| 2018/0006265 A1 | 1/2018 | Oh |

FOREIGN PATENT DOCUMENTS

| | | |
|---|---|---|
| KR | 10-2016-0035712 A | 4/2016 |
| KR | 10-2016-0090968 A | 8/2016 |
| KR | 10-1701978 B1 | 1/2017 |
| KR | 10-2017-0064386 A | 6/2017 |

\* cited by examiner

DISPLAY APPARATUS

CROSS-REFERENCE TO RELATED APPLICATION

Korean Patent Application No. 10-2018-0023900, filed on Feb. 27, 2018, in the Korean Intellectual Property Office, and entitled: "Display Apparatus," is incorporated by reference herein in its entirety.

BACKGROUND

1. Field

One or more embodiments relate to display apparatuses, and more particularly, to a display apparatus capable of preventing image quality degradation caused by external light.

2. Description of the Related Art

Display apparatuses have a display area in which many pixels are located. Lines for transmitting an electrical signal to be applied to the pixels located in the display area, circuits, and the like may be located outside the display area, e.g., in a peripheral area outside the display area.

SUMMARY

According to one or more embodiments, a display apparatus may include a substrate having a display area and a peripheral area outside the display area, a plurality of wirings over the peripheral area of the substrate, the plurality of wiring extending from a first area to a third area via a second area, wherein an interval between the plurality of wirings in the second area is greater than an interval between the plurality of wirings in each of the first area and the third area, an interlayer insulating layer covering the plurality of wirings, the interlayer insulating layer having a first uneven upper surface corresponding to the plurality of wirings, a first conductive layer over the interlayer insulating layer and including a second uneven upper surface corresponding to the first uneven upper surface, a planarization layer over the first conductive layer and exposing at least a portion of the first conductive layer in the second area, the planarization layer having an upper surface that is flat, a second conductive layer electrically connected to the first conductive layer in the second area, at least a portion of the second conductive layer being over the planarization layer, and a polarization plate on the second conductive layer.

The plurality of wirings may include a plurality of first wirings and a plurality of second wirings.

The plurality of first wirings may alternate with the plurality of second wirings. In detail, the display apparatus may further include a first gate insulating layer below the plurality of first wirings; and a second gate insulating layer below the interlayer insulating layer and covering the plurality of first wirings. The plurality of second wirings may be on the second gate insulating layer and correspond to spaces between the plurality of first wirings.

The display apparatus may further include a light-emitting device on the display area of the substrate, the light-emitting device including a pixel electrode, an intermediate layer, and an opposite electrode that are sequentially stacked, wherein the intermediate layer includes an emission layer. The opposite electrode may extend to the peripheral area and may be electrically connected to the second conductive layer. In this case, the opposite electrode may be in contact with a connection electrode that includes same material as the pixel electrode and contacts the second conductive layer.

The display apparatus may further include a first power line connected to the first conductive layer and extending to the display area; and a second power line connected to the second conductive layer and extending to the display area.

In this case, the first power line may be electrically connected to the second power line at a plurality of points.

The display apparatus may further include a light-emitting device on the display area of the substrate, the light-emitting device including a pixel electrode, an intermediate layer, and an opposite electrode that are sequentially stacked, wherein the intermediate layer includes an emission layer. The second power line may be electrically connected to the pixel electrode of the light-emitting device.

The first conductive layer may have a first end in a direction facing away from the display area and the second conductive layer may have a second end in the direction facing away from the display area, and the first end may be farther from the display area than the second end.

The display apparatus may further include a transmission window over the polarization plate and including a transmission area that corresponds to the display area and transmits light and a blocking area that is outside the transmission area and blocks light, wherein a portion of the first conductive layer that is outside the second end is shielded by the blocking area.

The display apparatus may further include a transmission window over the polarization plate and including a transmission area that corresponds to the display area and transmits light and a blocking area that is outside the transmission area and blocks light, wherein, when viewed in a direction perpendicular to the substrate, a boundary between the transmission area and the blocking area is closer to the display area than the second end.

The second end may be positioned within the second area. Alternatively, the second end may be positioned at a boundary between the first area and the second area.

The plurality of wirings may be bent at a boundary between the first area and the second area and may be bent at a boundary between the second area and the third area.

In this case, an extending direction of the plurality of wirings in the first area may be identical with an extending direction of the plurality of wirings in the third area.

An extending direction of the plurality of wirings in the second area may be perpendicular to the boundary between the first area and the second area.

An end of the planarization layer in a direction toward the first area may be positioned within the second area.

An end of the planarization layer in a direction toward the first area may be positioned at a boundary between the second area and the third area.

According to one or more embodiments, a display apparatus includes a substrate having a display area and a peripheral area outside the display area; a plurality of wirings over the peripheral area of the substrate and extending from a first area to a third area via a second area, wherein an interval between the plurality of wirings in the second area is greater than an interval between the plurality of wirings in the first area and the third area; an interlayer insulating layer covering the plurality of wirings and including a first upper surface having a first uneven surface corresponding to the plurality of wirings; a first conductive layer over the interlayer insulating layer, having a second upper surface having a second uneven surface corresponding to the first uneven surface, and including a first conductive part and a second conductive part spaced apart from each other; a planarization layer over the first conductive layer, having an upper surface that is flat, and exposing at least a portion of each of the first conductive part and the second conductive part of the first conductive layer in the second area; a second conductive layer including a third conductive part electrically connected to the first conductive part in the second area, and a fourth conductive part spaced apart from the third conductive part and electrically connected to the second conductive part in the second area, wherein at least a portion of the second conductive layer is over the planarization layer; and a polarization plate over the second conductive layer.

The first conductive part may have an end in a direction facing away from the display area and the third conductive layer may have an end in the direction facing away from the display area, and the end of the first conductive part may be farther from the display area than the end of the third conductive layer. The second conductive part may have an end in the direction facing away from the display area and the fourth conductive layer may have an end in the direction facing away from the display area, and the end of the second conductive part may be farther from the display area than the end of the fourth conductive layer. The display apparatus may further include a transmission window over the polarization plate and including a transmission area that corresponds to the display area and transmits light and a blocking area that is outside the transmission area and blocks light, wherein a portion of the first conductive part that is outside the end of the third conductive part and a portion of the second conductive part that is outside the end of the fourth conductive part are shielded by the blocking area.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
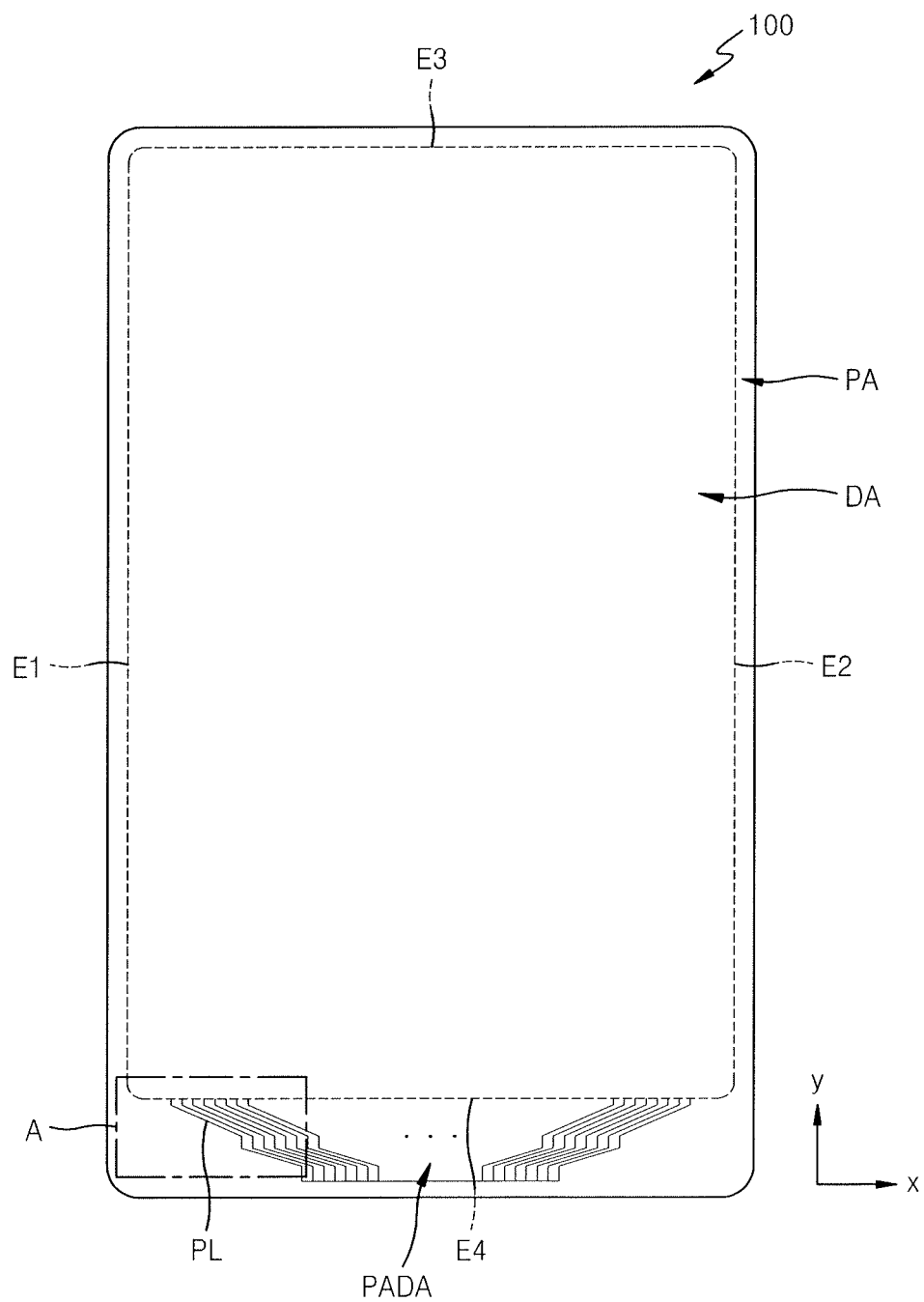
FIG. 1 illustrates a schematic plan view of a portion of a display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. Expressions such as "at least one of" when preceding a list of elements, modify the entire list of elements and do not modify the individual elements of the list.

In the disclosure, the x-axis, the y-axis, and the z-axis are not limited to the three axes of the rectangular coordinate system and may be interpreted in a broader sense. In an embodiment, the x-axis, the y-axis, and the z-axis may be perpendicular to one another or may represent different directions that are not perpendicular to one another.

Figure 2:
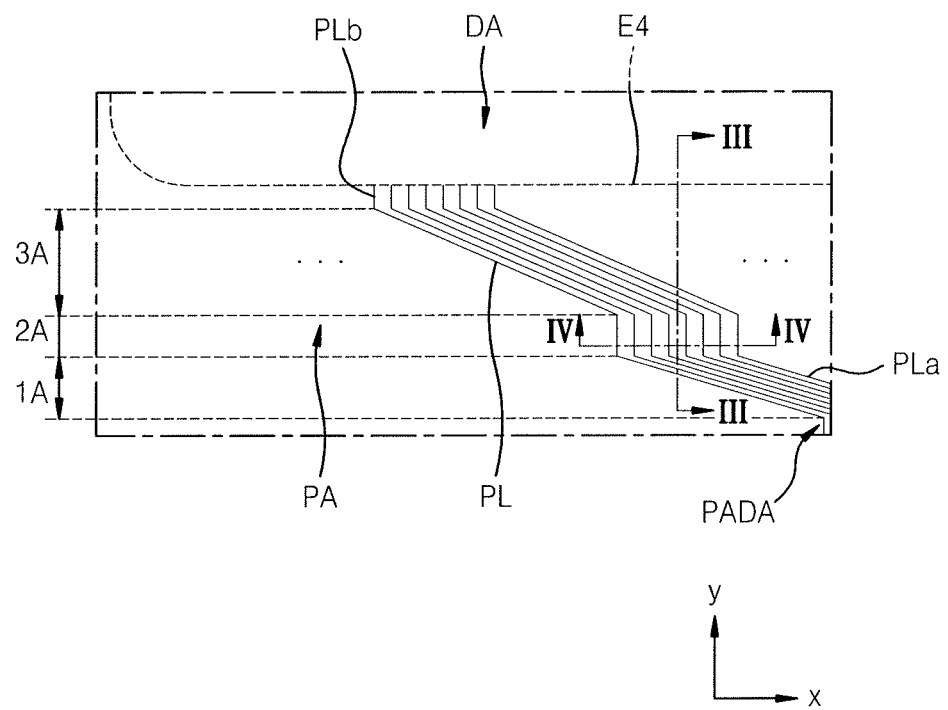
FIG. 2 illustrates a conceptual enlarged view of a portion A in FIG. 1.

FIG. 1 is a schematic plan view of a portion of a display apparatus according to an embodiment. FIG. 2 is a conceptual, enlarged view of portion A in FIG. 1.

Referring to FIG. 1, the display apparatus according to the present embodiment may include a substrate 100 that includes a display area DA, on which a plurality of pixels are located, and a peripheral area PA around the, e.g., entire perimeter of the, display area DA. The peripheral area PA includes a pad area PADA. Various electronic devices, e.g., an integrated circuit (IC), a printed circuit board (PCB), and the like, may be electrically connected to the pad area PADA.

The substrate 100 may include various materials having flexible or bendable characteristics. In an embodiment, the substrate 100 may include a polymer resin, e.g., polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP). For example, the substrate 100 may have a multi-layered structure including two layers including a polymer resin and a barrier layer including an inorganic material, e.g., silicon oxide, silicon nitride, silicon oxynitride, or the like, between the two polymer resin layers. In this way, various modifications may be made. Embodiments are not limited thereto and the substrate 100 may also include glass.

An edge of the display area DA may have a shape similar to a rectangle or a square. In detail, the display area DA may include a first edge E1 and a second edge E2 opposite to each other, and a third edge E3 and a fourth edge E4 opposite to each other and located between the first edge E1 and the second edge E2. The pad area PADA may be adjacent to the fourth edge E4 from among the first through fourth edges E1 through E4.

A plurality of wirings PL may be located on the peripheral area PA. For example, as illustrated in FIG. 1, the plurality of wirings PL may be connected to the display area DA, and may extend between opposite edges of the pad area PADA.

In detail, referring to FIG. 2, the plurality of wirings PL may extend from a first area 1A to a third area 3A via a second area 2A. As illustrated in FIG. 2, the first area 1A, the second area 2A, and the third area 3A may be arranged sequentially in the pad area PADA between the fourth edge E4 of the display area DA and an outermost edge of the substrate 100. The first area 1A may be farthest from the display area DA, i.e., closest to the outermost edge of the substrate 100, the third area 3A may be closest to the display area DA, and the second area 2A may be between the first and third areas 1A and 3A. In other words, the first area 1A may be farther from the display area DA than the second area 2A, and the third area 3A may be closer to the display area DA than the second area 2A. The first through third areas 1A through 3A are located within the peripheral area PA.

The plurality of wirings PL may transmit electrical signals that are to be applied to the pixels located in the display area DA, or may transmit electrical signals that are to be applied to a circuit unit located in the peripheral area PA outside the display area DA. The circuit unit located in the peripheral area PA may be, e.g., a shift register that generates a scan signal that is to be applied to scan lines SL located within the display area DA, as will be described later with reference to FIG. 11.

For example, since the plurality of wirings PL transmit electrical signals as described above, respective first ends PLa (in a −y direction) of the plurality of wirings PL are electrically connected to an integrated circuit (IC) or to a printed circuit board (PCB), and thus receive electrical signals that are to be transmitted to the pixels. To this end, referring to FIGS. 1 and 2, the respective first ends PLa of the plurality of wirings PL, i.e., ends adjacent the outermost edge of the substrate 100, are located close to each other along the x direction. Second respective ends PLb (in a +y direction) of the plurality of wirings PL, i.e., ends facing the display area DA, may be spaced apart from each other along the x direction more than the respective first ends PLa because of the locations of components that receive electrical signals from the plurality of wirings PL.

As such, the plurality of wirings PL extends from locations corresponding to their respective first ends PLa to locations corresponding to their second respective ends PLb. Thus, an interval between the plurality of wirings PL in the x direction differs according to locations, e.g., an interval between the plurality of wirings PL in the x direction differs according to the first through third areas 1A through 3A. In detail, an interval between the plurality of wirings PL along the x direction in the second area 2A is greater than an interval between the plurality of wirings PL along the x direction in the first area 1A, and is greater than an interval between the plurality of wirings PL along the x direction in the third area 3A.

This is because, as shown in FIG. 2, the second respective ends PLb of the plurality of wirings PL are spaced apart from each along the x direction more than the respective first ends PLa of the plurality of wirings PL, and the plurality of wirings PL extend obliquely with respect to the y direction in the first area 1A, are bent at a boundary between the first area 1A and the second area 2A, extend in a direction parallel to the y direction (i.e., in a direction perpendicular to the boundary between the first area 1A and the second area 2A) in the second area 2A, are bent again at a boundary between the second area 2A and the third area 3A, and extend obliquely with respect to the y direction in the third area 3A. For reference, the plurality of wirings PL are approximately parallel to each other in the first area 1A, the plurality of wirings PL are also approximately parallel to each other in the second area 2A, and the plurality of wirings PL are also approximately parallel to each other in the third area 3A.

Figure 3:
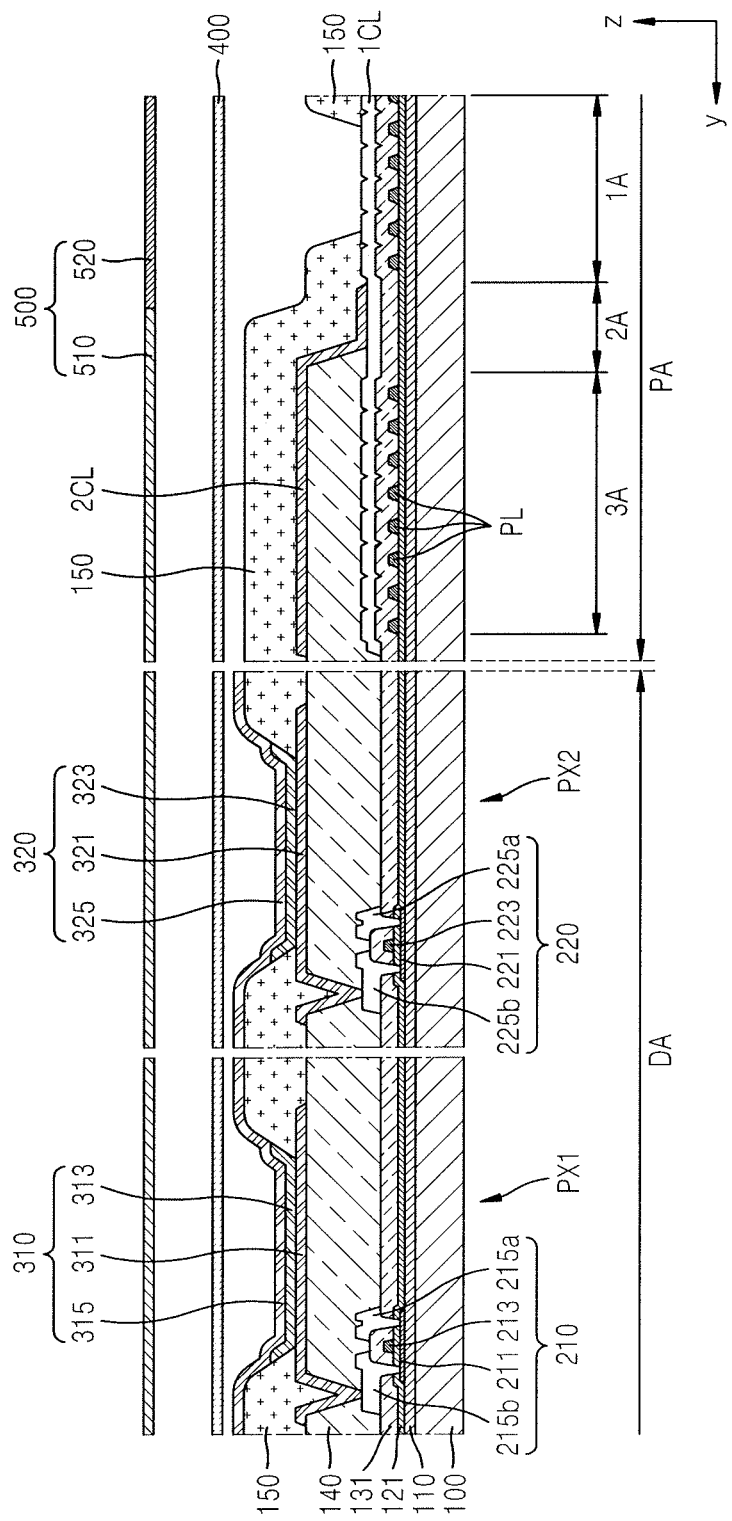
FIG. 3 illustrates a cross-sectional view taken along line III-III of FIG. 2.
Figure 4:
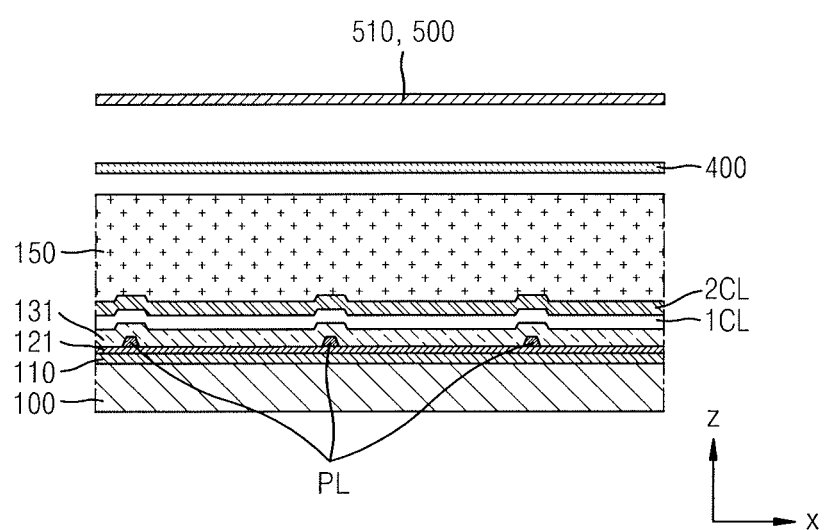
FIG. 4 illustrates a cross-sectional view taken along line IV-IV of FIG. 2.

FIG. 3 is a cross-sectional view taken along line of FIG. 2, and FIG. 4 is a cross-sectional view taken along line IV-IV of FIG. 2. FIG. 3 is a cross-sectional view illustrating portions spaced part from each other in FIG. 2, and thus does not show adjacent components, e.g., FIG. 3 illustrates a first pixel PX1 and a second pixel PX2 that are not close to each other. In addition, it is noted that FIG. 3 illustrates a cross-sectional view illustrating portions spaced part from each other in FIG. 2, and thus, cross-sections of the spaced-apart portions may not be in the same direction. In an embodiment, a cross-section of the first pixel PX1 may not be a cross-section on the same plane as a plane of a cross-section of the plurality of wirings PL. In other words, the line in FIG. 2 is shown as a straight line for convenience's sake, however, in practice, the line III-III in FIG. 2 may be a curved line or a line bent several times. Therefore, FIG. 3 may be understood as a cross-sectional view illustrating the first pixel PX1 and the second pixel PX2 within the display area DA of FIG. 2, and some of the plurality of wirings PL within the peripheral area PA of FIG. 2.

Referring to FIG. 3, first and second display devices 310 and 320 and first and second thin film transistors 210 and 220 electrically connected to the display devices 310 and 320, respectively, may be located in the display area DA of the substrate 100. Referring to FIG. 3, organic light-emitting diodes (OLEDs) as the first and second display devices 310 and 320 are located in the display area DA. The OLEDs electrically connected to the first and second thin film transistors 210 and 220 may be understood as first and second pixel electrodes 311 and 321 respectively electrically connected to the first and second thin film transistors 210 and 220.

According to an embodiment, FIG. 3 illustrates the first thin film transistor 210 located in the first pixel PX1, the second thin film transistor 220 located in the second pixel PX2, the first display device 310 electrically connected to the first thin film transistor 210, and the second display device 320 electrically connected to the second thin film transistor 220. The first thin film transistor 210 and the first display device 310 will now be described for convenience sake. This description is equally applicable to the second thin film transistor 220 and the second display device 320. In other words, descriptions of a second semiconductor layer 221, a second gate electrode 223, a second source electrode 225a, and a second drain electrode 225b of the second thin film transistor 220, and descriptions of the second pixel electrode 321, an opposite electrode 325, and an intermediate layer 323 of the second display device 320 will be omitted. For reference, the opposite electrode 325 of the second display device 320 may be integrally formed with an opposite electrode 315 of the first display device 310, e.g., the opposite electrodes 315 and 325 may be formed integrally as a single and continuous electrode.

The first thin film transistor 210 may include a first semiconductor layer 211, a first gate electrode 213, a first source electrode 215a, and a first drain electrode 215b, the first semiconductor layer 211 including, e.g., amorphous silicon, crystalline silicon, or an organic semiconductor material. To secure insulation between the first semiconductor layer 211 and the first gate electrode 213, a first gate insulating layer 121 may be between the first semiconductor layer 211 and the first gate electrode 213. The first gate insulating layer 121 may include an inorganic material, e.g., silicon oxide, silicon nitride, and/or silicon oxynitride.

A first interlayer insulating layer 131 may be over the first gate electrode 213 and may include an inorganic material, e.g., silicon oxide, silicon nitride, and/or silicon oxynitride, and the first source electrode 215a and the first drain electrode 215b may be on the first interlayer insulating layer 131. Such an insulating layer including an inorganic material may be formed via chemical vapor deposition (CVD) or atomic layer deposition (ALD). This is equally applied to embodiments to be described later and modifications thereof.

The first gate electrode 213, the first source electrode 215a, and the first drain electrode 215b may include various conductive materials. The first gate electrode 213 may include, e.g., molybdenum (Mo) or aluminum (Al), and, if necessary, may have a multi-layered structure. For example, the first gate electrode 213 may be a three-layered structure including a Mo layer, an Al layer, and a Mo layer. The first source electrode 215a and the first drain electrode 215b may include, e.g., titanium (Ti) or Al. As necessary, each of the first source electrode 215a and the first drain electrode 215b may have a multi-layered structure. In an embodiment, each of the first source electrode 215a and the first drain electrode 215b may be a three-layered structure including a Ti layer, an Al layer, and a Ti layer. Embodiments are not limited thereto.

A buffer layer 110 may be between the first thin film transistor 210 having the above structure and the substrate 100, and may include an inorganic material, e.g., silicon oxide, silicon nitride, and/or silicon oxynitride. The buffer layer 110 may increase smoothness of an upper surface of the substrate 100 or prevent or minimize infiltration of impurities from the substrate 100 and the like into the first semiconductor layer 211 of the first thin film transistor 210.

A planarization layer 140 may be on the first thin film transistor 210. In an embodiment, when an OLED is disposed over the first thin film transistor 210 as illustrated in FIG. 3, the planarization layer 140 may planarize an upper portion of a protection layer that covers the first thin film transistor 210. The planarization layer 140 may include an organic material, e.g., benzocyclobutene (BCB) or hexamethyldisiloxane (HMDSO). Although the planarization layer 140 is shown as being a single layer in FIG. 3, various modifications may be made to the planarization layer 140. In another embodiment, the planarization layer 140 may be a stack of multiple layers.

The first display device 310 may be located on the planarization layer 140 in the display area DA of the substrate 100. The first display device 310 may be, in an embodiment, an OLED having the first pixel electrode 311, the opposite electrode 315, and an intermediate layer 313 between the first pixel electrode 311 and the opposite electrode 315 and including an emission layer. The first pixel electrode 311 may contact one of the first source electrode 215a and the first drain electrode 215b via an opening formed in the planarization layer 140 as shown in FIG. 3, and is electrically connected to the first thin film transistor 210. The first pixel electrode 311 may include, e.g., ITO, IZO, or $In_2O_3$. The first pixel electrode 311 may include a material different from the aforementioned material, as necessary. In an embodiment, the first pixel electrode 311 may include a metal, e.g., Al or copper (Cu).

A pixel defining layer 150 may be over the planarization layer 140. The pixel defining layer 150 defines pixels by including respective openings corresponding to sub-pixels, i.e., an opening via which at least a center portion of the first pixel electrode 311 is exposed. In such a case, as illustrated in FIG. 3, the pixel defining layer 150 prevents an arc or the like from occurring at an edge of the first pixel electrode 311 by increasing a distance between the edge of the first pixel electrode 311 and the opposite electrode 315 disposed over the first pixel electrode 311. The pixel defining layer 150 may be formed of an organic material, e.g., PI or HMDSO.

The intermediate layer 313 of the OLED may include a low-molecular or high-molecular weight material. When the intermediate layer 313 includes a low-molecular weight material, the intermediate layer 313 may have a structure in which a hole injection layer (HIL), a hole transport layer (HTL), an emission layer (EML), an electron transport layer (ETL), and an electron injection layer (EIL) are stacked in a single or complex structure, and may be formed by vacuum deposition. When the intermediate layer 313 includes a high-molecular weight material, the intermediate layer 313 may have a structure including an HTL and an EML. In this case, the HTL may include poly(ethylenedioxythiophene) (PEDOT), and the EML may include a high-molecular weight material, e.g., polyphenylenevinylene (PPV)-based material or a polyfluorene-based material. The intermediate layer 313 may be formed by screen printing, inkjet printing, laser induced thermal imaging (LITI), or the like. The intermediate layer 313 is not limited to the above-described structure, and may have any of various other structures. The intermediate layer 313 may include a single layer that covers a plurality of pixel electrodes 311 and 321 or may include patterned layers respectively corresponding to the plurality of pixel electrodes 311 and 321.

The opposite electrode 315 may be over the display area DA and may cover the display area DA. In other words, the opposite electrode 315 may be formed as a single body constituting a plurality of OLEDs and thus may correspond to the plurality of pixel electrodes 311 and 321.

The plurality of wirings PL is located on the peripheral area PA, and the plurality of wirings PL may be on the first gate insulating layer 121. In this case, during the manufacture of the display apparatus, the plurality of wirings PL may be formed simultaneously with the first gate electrode 213 of the same material for forming the first gate electrode 213 of the first thin film transistor 210. The plurality of wirings PL may transmit an electrical signal that is to be applied to the first and/or second pixels PX1 and/or PX2 located in the display area DA, or may transmit an electrical signal that is to be applied to a circuit unit located in the peripheral area PA outside the display area DA. The circuit unit located in the peripheral area PA may be, e.g., a shift register that generates a scan signal that is to be applied to scan lines SL located within the display area DA, as will be described later with reference to FIG. 11.

Like the first interlayer insulating layer 131 covering the first gate electrode 213 and the second gate electrode 223 in the display area DA, the first interlayer insulating layer 131 covers the plurality of wirings PL in the peripheral area PA. In other words, the first interlayer insulating layer 131 may extend from the display area DA to the peripheral area PA, e.g., the first interlayer insulating layer 131 may be a same and continuous layer that extends from the display area DA to the peripheral area PA. Because the first interlayer insulating layer 131 includes an inorganic material, e.g., silicon oxide, silicon nitride, and/or silicon oxynitride, as described above, an upper surface of the first interlayer insulating layer 131 has a shape corresponding to the components located below the first interlayer insulating layer 131, e.g., the first interlayer insulating layer 131 may be conformal on the plurality of wirings PL. In other words, because the plurality of wirings PL exist below the first interlayer insulating layer 131, a first upper surface of the first interlayer insulating layer 131 has a first uneven surface corresponding to the plurality of wirings PL.

The first uneven surface of the first interlayer insulating layer 131 does not simply mean that convex portions and concave portions exist. As resolution of the display apparatus increases, the number of wirings PL that transmit electrical signals to be applied to the display area DA or a driving circuit unit outside the display area DA increases. An increase in the proportion of an area occupied by the display area DA in the display apparatus may be achieved by decreasing the area of the peripheral area PA. Accordingly, an interval between the plurality of wirings PL that transmit electrical signals is decreased. Therefore, referring to FIG. 3, the first uneven surface of the first upper surface of the first interlayer insulating layer 131 has "V"-shaped valleys at locations corresponding to, e.g., overlapping, the spaces between the plurality of wirings PL. The first uneven surface means a surface having "V"-shaped valleys at locations corresponding to the spaces between the plurality of wirings PL as described above. This is the same in embodiments to be described later and modifications thereof.

In the peripheral area PA, a first conductive layer 1CL is located on the first interlayer insulating layer 131. Because the first source electrode 215a, the first drain electrode 215b, the second source electrode 225a, and the second drain electrode 225b are located on the first interlayer insulating layer 131 in the display area DA as described above, the first conductive layer 1CL may be formed of the same material as that used to form the first source electrode 215a, the first drain electrode 215b, the second source electrode 225a, and the second drain electrode 225b, simultaneously with the forming of the first source electrode 215a, the first drain electrode 215b, the second source electrode 225a, and the second drain electrode 225b, during the manufacture of the display apparatus.

As described above, the first upper surface of the first interlayer insulating layer 131 has the first uneven surface corresponding to the plurality of wirings PL. Accordingly, a second upper surface of the first conductive layer 1CL formed on the first interlayer insulating layer 131 has a second uneven surface corresponding to the first uneven surface.

As such, the planarization layer 140 is located on the first conductive layer 1CL including the second upper surface having the second uneven surface. In the display area DA, the planarization layer 140 is on the first thin film transistor 210 and the second thin film transistor 220, and accordingly the planarization layer 140 including an organic material has an approximately flat upper surface even when the first thin film transistor 210 and the second thin film transistor 220 exist below the planarization layer 140. Also, in the peripheral area PA, the planarization layer 140 is located on the first conductive layer 1CL including the second upper surface having the second uneven surface, and the upper surface of the planarization layer 140 has an approximately flat shape. During the manufacture of the display apparatus, the planarization layer 140 in the peripheral area PA may be formed simultaneously with the planarization layer 140 in the display area DA of the same material for forming the planarization layer 140 in the display area DA. Accordingly, the planarization layer 140 in the peripheral area PA may have the same structure as that of the planarization layer 140 in the display area DA. The planarization layer 140 may have a single body structure extending from the display area DA to the peripheral area PA, or, if necessary, may have a discontinuous section within the peripheral area PA.

In the peripheral area PA, a second conductive layer 2CL is located on the planarization layer 140. Because the upper surface of the planarization layer 140 is approximately flat, the upper surface of the second conductive layer 2CL has also an approximately flat shape. Because the first pixel electrode 311 and the second pixel electrode 321 are located on the planarization layer 140 in the display area DA, the second conductive layer 2CL may be formed of the same material as that used to form the first pixel electrode 311 and the second pixel electrode 321, simultaneously with the forming of the first pixel electrode 311 and the second pixel electrode 321, during the manufacture of the display apparatus.

The second conductive layer 2CL is electrically connected to the first conductive layer 1CL. To this end, as shown in FIG. 3, the planarization layer 140 may expose at least a portion of the first conductive layer 1CL, and thus the second conductive layer 2CL may directly contact the first conductive layer 1CL. In detail, the planarization layer 140 may expose at least a portion of the first conductive layer 1CL in the second area 2A, and may cover the first conductive layer 1CL in the third area 3A that is closer to the display area DA than the second area 2A. To this end, an end of the planarization layer 140 in a direction toward the first area 1A (in the −y direction) may be located within the second area 2A. An end of the planarization layer 140 in the direction toward the first area 1A (in the −y direction) may be located at a boundary between the second area 2A and the third area 3A.

A polarization plate 400 is located over the second conductive layer 2CL. The polarization plate 400 reduces a degree to which external light incident upon the display apparatus is reflected, and thus, visibility of an image displayed on the display area DA as seen by a user is prevented from degrading. In an embodiment, a first light, which is a portion of light incident upon the polarization plate 400, enters the polarization plate 400, is reflected by the flat upper surface of the second conductive layer 2CL, and is emitted back to the outside of the display apparatus via the polarization plate 400. A second light, which is another portion of the light incident upon the polarization plate 400, is reflected by the flat upper surface of the second conductive layer 2CL. At this time, while the first light is passing through the polarization plate 400 twice, a phase of the first light is changed, and thus may be opposite to a phase of the second light. Accordingly, the first light and the second light destructively interfere with each other, and consequently, visibility of an image displayed on the display area DA as seen by the user may be effectively prevented or reduced from being degraded by external light. In the display area DA, the opposite electrodes 315 and 325 may serve as the second conductive layer 2CL.

If the second conductive layer 2CL having a flat upper surface does not exist in the peripheral area PA, the first light transmitted through the polarization plate 400 is reflected by the upper surface of the first conductive layer 1CL below the polarization plate 400. However, the upper surface of the first conductive layer 1CL includes the second upper surface, and, as described above, the second upper surface includes the second uneven surface. Accordingly, a portion of the first light incident upon the second uneven surface is diffusely reflected, and thus may not provoke destructive interference with the second light reflected by the polarization plate 400. In detail, when the first light is reflected by "V"-shaped valleys of the second uneven surface and not by a relatively flat upper surface of the second uneven surface as shown in FIG. 3, the first light is diffusely reflected, and consequently, no destructive interference may occur between the first light and the second light reflected by the polarization plate 400. When a user sees external light that is reflected in the peripheral area PA even when no images are displayed on the peripheral area PA, visibility of an image displayed on the display area DA as seen by the user may degrade due to the external light.

In addition, because the second uneven surface is formed by the plurality of wirings PL below the second uneven surface, a portion of the second uneven surface by which light is diffusely reflected is consequently a portion corresponding to the plurality of wirings PL below the second uneven surface. Accordingly, when a user recognizes diffusely-reflected light, this brings the same result as the user recognizing the shape of the plurality of wirings PL below the second uneven surface, which degrades the image visibility of the display apparatus.

In contrast, in the display apparatus according to the present embodiment, as described above, the planarization layer 140 having an approximately flat upper surface covers most of the first conductive layer 1CL, and the second conductive layer 2CL having an approximately flat upper surface is located on the planarization layer 140, i.e., the planarization layer 140 is between the first and second conductive layers 1CL and 2CL. Accordingly, a problem as described above may be effectively prevented.

In the second area 2A where the second conductive layer 2CL contacts the first conductive layer 1CL, the planarization layer 140 exposes at least a portion of the first conductive layer 1CL. Accordingly, the upper surface of the second conductive layer 2CL corresponds to the upper surface of the first conductive layer 1CL in terms of shape. However, as described above, an interval between the plurality of wirings PL in the second area 2A is greater than an interval between the plurality of wirings PL in the first area 1A and greater than an interval between the plurality of wirings PL in the third area 3A.

FIG. 4 shows an arrangement of the plurality of wirings PL in the second area 2A. Thus, referring to FIG. 4, the interval between the plurality of wirings PL in the second area 2A is greater than the interval between the plurality of wirings PL in the first area 1A and/or the interval between the plurality of wirings PL in the third area 3A shown in FIG. 3. Accordingly, even when there are no planarization layers 140 in the second area 2A, no "V"-shaped valleys are formed on the upper surface of the second conductive layer 2CL, e.g., due to the larger distance between the wirings PL along the x direction. In the second area 2A, while indentations may be formed in a portion of the upper surface of the second conductive layer 2CL, as the area of the portion where indentations are formed is very narrow, a very small amount of light is diffusely reflected by the portion including the indentations. Accordingly, in the second area 2A, the probability that the visibility of an image displayed in this area is degraded by reflection of the external light is very low.

In an embodiment, a width of each of the plurality of wirings PL in the third area 3A, as shown in FIG. 3, is about 2 μm to about 3 μm, and a width of a space between two adjacent wirings PL is about 0.8 μm to about 2 μm. However, an interval between the plurality of wirings PL in the second area 2A, as shown in FIG. 4, is about 20 μm. Accordingly, in the second area 2A, the probability that the visibility of an image displayed in this area is degraded by the reflection of the external light is very low. In an embodiment, when the width of the space between adjacent wirings PL is about 3 μm or more, the probability that the visibility of an image displayed on this area is degraded by the reflection of the external light is very low. In an embodiment, when the width of each of the plurality of wirings PL is about 2 μm and a distance between a center of one of two adjacent wirings PL and a center of the other is about 5 μm, the width of the space between the two adjacent wirings PL becomes about 3 μm, and accordingly, the probability that the visibility of an image displayed in this area is degraded by the reflection of the external light becomes very low.

Referring to FIG. 3, the second conductive layer 2CL may not be formed on at least a portion of the first area 1A of the peripheral area PA. Referring to FIG. 3, the second conductive layer 2CL is located only in the second area 2A and the third area 3A and is not located in the first area 1A. In other words, a first end of the first conductive layer 1CL in the direction facing away from the display area DA (in the −y direction) may be farther from the display area DA than a second end of the second conductive layer 2CL in the direction facing away from the display area DA (in the −y direction). In FIG. 3, the first conductive layer 1CL exists also in the first area 1A, but the second end of the second conductive layer 2CL is at the boundary between the first area 1A and the second area 2A or within the second area 2A. Therefore, in the first area 1A, light incident from the outside of the display apparatus via the polarization plate 400 is reflected by the upper surface of the first conductive layer 1CL below the polarization plate 400, i.e., as the second conductive layer 2CL is not formed in the first area 1A. The upper surface of the first conductive layer 1CL includes the second upper surface, and, as described above, the second upper surface includes the second uneven surface. Accordingly, a portion of the first light incident upon the second uneven surface is diffusely reflected, and consequently visibility of a user may degrade.

However, the display apparatus according to the present embodiment may further include a transmission window 500, as shown in FIG. 3, to prevent light from diffusely reflecting from the second uneven surface in the first area 1A. The transmission window 500 is over the polarization plate 400 and includes a transmission area 510 and a blocking area 520. The transmission area 510 corresponds to, e.g., overlaps, at least the display area DA and transmits light. The blocking area 520 is around the transmission area 510 and may block light. Accordingly, the blocking area 520 may be above the first area 1A to block light incident thereon, i.e., blocking a portion of the first conductive layer 1CL that is outside the second end of the second conductive layer 2CL, thereby preventing degradation of user's visibility due to reflection.

When the transmission area 510 of the transmission window 500 accurately corresponds to the display area DA and the blocking area 520 of the transmission window 500 accurately corresponds to the peripheral area PA, there is no need to make the upper surface of the second conductive layer 2CL be approximately flat in the third area 3A as described above, because the blocking area 520 blocks the third area 3A. However, during the manufacture of the display apparatus, an accurate alignment between the transmission area 510 and the display area DA may not be guaranteed, and thus tolerance inevitably exists. This tolerance may cause degradation of image visibility in the third area 3A, and thus, as described above, the upper surface of the second conductive layer 2CL is substantially flat in the third area 3A.

Referring to FIG. 3, a boundary between the transmission area 510 and the blocking area 520 of the transmission window 500 is within the second area 2A. Referring to FIG.

4, which illustrates a cross-sectional view showing a cross-section in the second area 2A, the transmission area 510 is illustrated. However, the disclosure is not limited thereto. Degradation of image visibility in the third area 3A may be further prevented by positioning the boundary between the transmission area 510 and the blocking area 520 to be closer to the display area DA than the second end of the second conductive layer 2CL along the x direction, when viewed in a direction perpendicular to the substrate 100 (in a −z direction).

The description above regarding the transmission window 500 is also valid for embodiments to be described later and modifications thereof.

Referring back to FIG. 3, the pixel defining layer 150 located in the display area DA extends over a portion of the peripheral area PA as necessary, and thus may cover and protect the second conductive layer 2CL. In the peripheral area PA, the pixel defining layer 150 may have an opening and thus may be divided into two portions spaced part from each other. In FIG. 3, the pixel defining layer 150 has an opening in the first area 1A.

Referring to FIGS. 3 and 4, no element is located between the pixel defining layer 150 covering the second conductive layer 2CL and the polarization plate 400. However, this is only for convenience of illustration, and various components may be interposed between the pixel defining layer 150 covering the second conductive layer 2CL and the polarization plate 400. Because OLEDs may be easily damaged by external moisture, oxygen, or the like, an encapsulation layer may cover and protect these OLEDs. Because the encapsulation layer may cover the display area DA and extend over at least a portion of the peripheral area PA, the encapsulation layer may also be located between the second conductive layer 2CL and the polarization plate 400. The encapsulation layer may include, e.g., a first inorganic encapsulation layer, an organic encapsulation layer, and a second inorganic encapsulation layer. If necessary, various components in addition to the encapsulation layer may be located between the second conductive layer 2CL and the polarization plate 400.

As described above, the planarization layer 140 is located on the first conductive layer 1CL including the second upper surface having the second uneven surface. In addition, because the planarization layer 140 includes an organic material, even when the first conductive layer 1CL having the second uneven surface exists below the planarization layer 140, the upper surface of the planarization layer 140 has an approximately flat shape. Because the planarization layer 140 includes an organic material, a gas may be generated from the planarization layer 140 during a manufacturing process after the planarization layer 140 is formed or during a usage process after the completion of the manufacture. When this gas is not exhausted to the outside of the planarization layer 140, the planarization layer 140 may swell later. This may cause defects to occur in a conductive layer or a line over and below the planarization layer 140. Thus, the generated gas needs to be exhausted to the outside of the planarization layer 140.

Therefore, according to embodiments, the second conductive layer 2CL may have a through hole in the third area 3A. Accordingly, a gas generated from the planarization layer 140 having an organic material may be exhausted to the outside via the through hole, and thus occurrence of defects as described above may be effectively prevented.

The first conductive layer 1CL and the second conductive layer 2CL may serve as an electrode power supply line. Because the opposite electrode 315 of the first display device 310 may be integrally formed with the opposite electrode 325 of the second display device 320 as described above, potential of the opposite electrodes 315 and 325 needs to be constantly maintained. To this end, the opposite electrodes 315 and 325 integrally formed with each other extend to outside of the display area DA and are electrically connected to a conductive layer having a constant potential, i.e., an electrode power supply line. The first conductive layer 1CL and the second conductive layer 2CL may serve as the electrode power supply line electrically connected to the opposite electrodes 315 and 325 in the peripheral area PA. In this case, the opposite electrodes 315 and 325 may directly contact the second conductive layer 2CL. In this case, if necessary, a through hole is formed in an extension portion of the pixel defining layer 150 in the peripheral area PA, and thus the opposite electrodes 315 and 325 may directly contact the second conductive layer 2CL. Alternatively, the second conductive layer 2CL is exposed to outside of the extension portion of the pixel defining layer 150 in the peripheral area PA, and the opposite electrodes 315 and 325 may directly contact the exposed portion of the second conductive layer 2CL.

Alternatively, the first conductive layer 1CL and the second conductive layer 2CL may be electrically connected to a power line. Power needs to be connected to the first pixel electrode 311 of the first display device 310 and the second pixel electrode 321 of the second display device 320 as described above via the first and second thin film transistors 210 and 220. To this end, the power line may extend from the peripheral area PA to the display area DA.

The power line may include a first power line connected to the first conductive layer 1CL and extending to the display area DA, and a second power line connected to the second conductive layer 2CL and extending to the display area DA. For example, the first power line may be integrally formed with the first conductive layer 1CL, and the second power line may be integrally formed with the second conductive layer 2CL. In the display area DA, an insulating layer, such as the planarization layer 140, may be interposed between the first power line and the second power line. However, through holes may be formed in the insulating layer at a plurality of points within the display area DA, and thus the first power line and the second power line may contact each other at the plurality of points within the display area DA. An intermediate conductive layer may be interposed between the first power line and the second power line, and thus the intermediate conductive layer may contact the first power line and the second power line may contact the intermediate conductive layer. Consequently, in the display area DA, the first power line and the second power line may be electrically connected to each other at the plurality of points. In any case, the second power line is electrically connected to the pixel electrodes 311 and 321 of the OLEDs. An example of a detailed shape of the power line will be described later.

Figure 5:
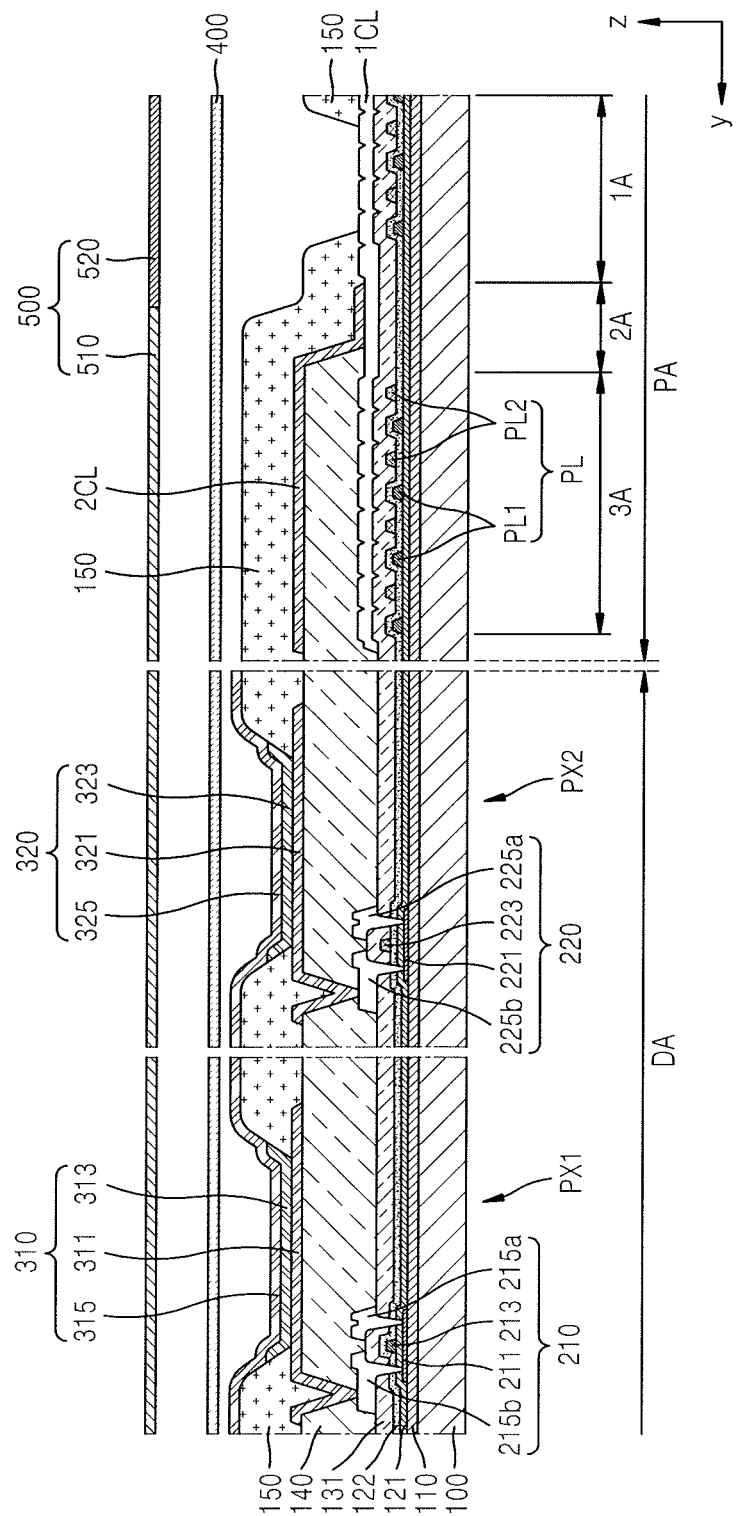
FIGS. 5 and 6 illustrate cross-sectional views of a portion of a display apparatus according to another embodiment.
Figure 6:
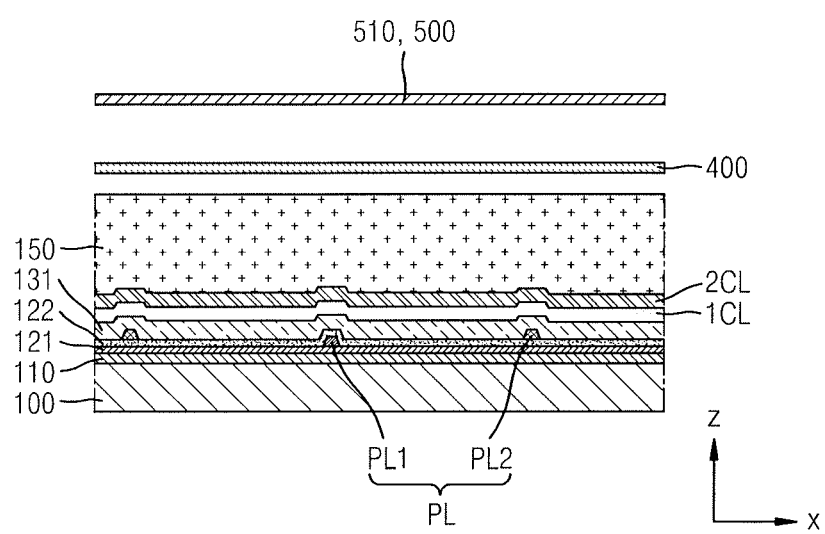

A case where the first gate electrode 213 of the first thin film transistor 210 and the second gate electrode 223 of the second thin film transistor 220 are located on the same layer has been described above, but embodiments are not limited thereto. For example, as shown in FIGS. 5 and 6, which are cross-sectional views of a portion of a display apparatus according to another embodiment, a second gate insulating layer 122 covering the first gate electrode 213 of the first thin film transistor 210 may be further included in addition to the first gate insulating layer 121, and the second gate electrode 223 of the second thin film transistor 220 may be located on the second gate insulating layer 122. In other words, the first gate electrode 213 and the second gate electrode 223 may be located on different layers. The first source electrode 215a, the first drain electrode 215b, the second source electrode 225a, and the second drain electrode 225b are located on the first interlayer insulating layer 131 that covers the second gate electrode 223. The second gate insulating layer 122 may include an inorganic material, e.g., silicon oxide, silicon nitride, and/or silicon oxynitride.

In this case, the plurality of wirings PL may include a plurality of first wirings PL1 and a plurality of second wirings PL2. The plurality of first wirings PL1 may be located on the same layer on which the first gate electrode 213 of the first thin film transistor 210 is located, and the plurality of second wirings PL2 may be located on the same layer on which the second gate electrode 223 of the second thin film transistor 220 is located. In other words, during the manufacture of the display apparatus, the plurality of first wirings PL1 may be formed of the same material as that used to form the first gate electrode 213 of the first thin film transistor 210, simultaneously with the forming of the first gate electrode 213, and the plurality of second wirings PL2 may be formed of the same material as that used to form the second gate electrode 223 of the second thin film transistor 220, simultaneously with the forming of the second gate electrode 223.

In addition, the plurality of first wirings PL1 and the plurality of second wirings PL2 may be located by alternating with each other. The plurality of second wirings PL2 may be located to correspond to the spaces between the plurality of first wirings PL1. When the number of wirings PL increases in the peripheral area PA and all of the plurality of wirings PL are located on the same layer, an interval between the wirings PL decreases, and a short-circuit may occur between the wirings PL. However, the plurality of first wirings PL1 and the plurality of second wirings PL2 alternate with each other with the second gate insulating layer 122 between the plurality of first wirings PL1 and the plurality of second wirings PL2, thereby effectively preventing occurrence of a short-circuit.

Even in this case, the upper surface of the second gate insulating layer 122 is not flat due to the plurality of first wirings PL1 below the second gate insulating layer 122, and the upper surface of the first interlayer insulating layer 131 covering the second gate insulating layer 122 and the plurality of second wirings PL2 is not flat either. In detail, similar to the first upper surface of the first interlayer insulating layer 131 of the display apparatus according to the embodiment described above with reference to FIG. 3, a first upper surface of the first interlayer insulating layer 131 of FIG. 5 has the first uneven surface having the "V"-shaped valleys at locations corresponding to the spaces between the plurality of wirings PL. In FIG. 5, a first conductive layer 1CL over the first interlayer insulating layer 131 also has a second upper surface having a second uneven surface corresponding to the first uneven surface.

In the display apparatus according to the present embodiment, similar to the display apparatus according to the embodiment described above with reference to FIG. 3, the planarization layer 140 having an approximately flat upper surface covers the first conductive layer 1CL, and the second conductive layer 2CL having an approximately flat upper surface is located on the planarization layer 140. Accordingly, occurrence of a diffuse reflection or the like may be effectively prevented or reduced.

The descriptions of a structure of electrical connection between the first conductive layer 1CL and the second conductive layer 2CL and a shape of the transmission window 500, and the description of an electrode power supply line or a power line given above with reference to FIG. 3 and/or FIG. 4 are applicable to the display apparatus according to the present embodiment. The display apparatus according to the present embodiment of FIGS. 5 and 6 may be modified in various ways. For example, all features according to the embodiments described above with reference to FIG. 3 and/or FIG. 4 are equally applicable to the display apparatus of FIG. 5 and/or FIG. 6, except that the plurality of wirings PL include the plurality of first wirings PL1 and the plurality of second wirings PL2, and the plurality of first wirings PL1 and the plurality of second wirings PL2 are located on different layers.

Figure 7:
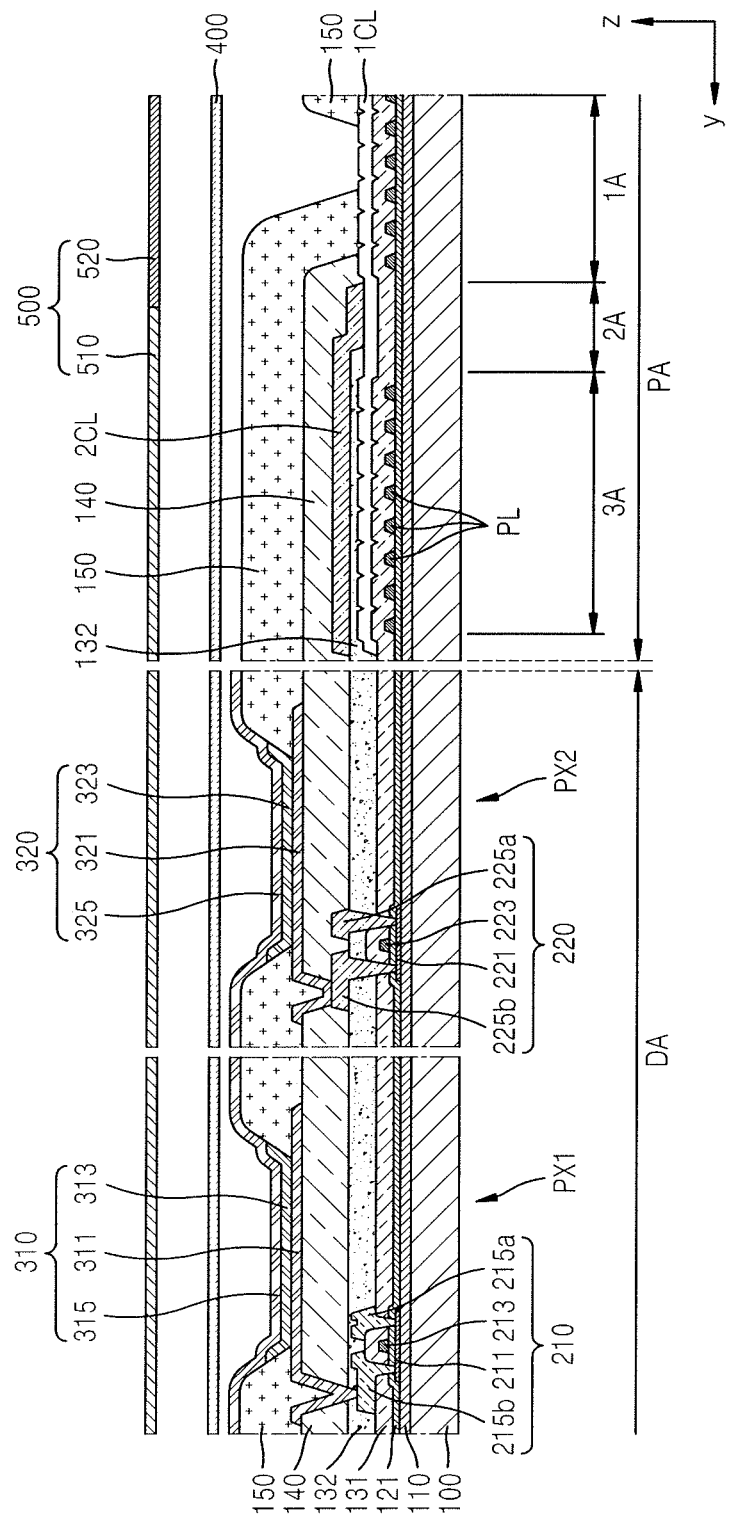
FIG. 7 illustrates a cross-sectional view of a portion of a display apparatus according to another embodiment.

A case where the first source electrode 215a and the first drain electrode 215b of the first thin film transistor 210 and the second source electrode 225a and the second drain electrode 225b of the second thin film transistor 220 are located on the same layer has been described above, but embodiments are not limited thereto. FIG. 7 illustrates a cross-sectional view of a portion of a display apparatus according to another embodiment. Referring to FIG. 7, a second interlayer insulating layer 132 covering the first source electrode 215a and the first drain electrode 215b of the first thin film transistor 210 may be further included in addition to the first interlayer insulating layer 131 covering the first or second gate electrode 213 or 223, and the second source electrode 225a and the second drain electrode 225b of the second thin film transistor 220 may be located on the second interlayer insulating layer 132. The first source electrode 215a and the first drain electrode 215b may be on a different layer from a layer on which the second source electrode 225a and the second drain electrode 225b are located. The second interlayer insulating layer 132 may be formed of an organic material, e.g., PI or HMDSO. Even in this case, if necessary, the first source electrode 215a and the first drain electrode 215b may include the same material as the second source electrode 225a and the second drain electrode 225b, and may have the same structure as the second source electrode 225a and the second drain electrode 225b.

In this case, in the peripheral area PA, the first conductive layer 1CL located over the first interlayer insulating layer 131 covering the plurality of wirings PL may be covered by the second interlayer insulating layer 132. The second interlayer insulating layer 132 may be formed to have an approximately flat upper surface by including an organic material. Accordingly, the second conductive layer 2CL is formed on the second interlayer insulating layer 132 such that the upper surface of the second conductive layer 2CL is also approximately flat. Consequently, external light may be reflected by the second conductive layer 2CL having the approximately flat upper surface, before reaching the first conductive layer 1CL of which the upper surface is not flat. In other words, the second interlayer insulating layer 132 of the display apparatus according to the present embodiment may be understood as serving as the planarization layers 140 of the display apparatuses according to the above-described embodiments. Accordingly, the descriptions of the planarization layers 140 of the display apparatuses according to the above-described embodiments are applicable to the second interlayer insulating layer 132 of the display apparatus according to the present embodiment.

In an embodiment, the second interlayer insulating layer 132 may expose at least a portion of the first conductive layer 1CL in the second area 2A, and may cover the first conductive layer 1CL in the third area 3A closer to the display area DA than the second area 2A. To this end, an end of the second interlayer insulating layer 132 in the direction toward the first area 1A (in the −y direction) may be located within the second area 2A. Alternatively, the end of the second interlayer insulating layer 132 in the direction toward the first area 1A (in the −y direction) may be located at a boundary between the second area 2A and the third area 3A.

As the second conductive layer 2CL is located on the second interlayer insulating layer 132, the second conductive layer 2CL may be formed of the same material as that used to form the second source electrode 225a and the second drain electrode 225b of the second thin film transistor 220, simultaneously with the forming of the second source electrode 225a and the second drain electrode 225b, during the manufacture of the display apparatus. As illustrated in FIG. 7, the second conductive layer 2CL is covered by the planarization layers 140. Although not shown in FIG. 7, the second conductive layer 2CL on the second interlayer insulating layer 132 may have a through hole for discharging a gas generated in the second interlayer insulating layer 132 including an organic material. When the second conductive layer 2CL has a through hole, the through hole is filled with the planarization layer 140.

The first conductive layer 1CL and the second conductive layer 2CL may serve as an electrode power supply line. Because the opposite electrode 315 of the first display device 310 may be integrally formed with the opposite electrode 325 of the second display device 320 as described above, potential of the opposite electrodes 315 and 325 needs to be constantly maintained. To this end, the opposite electrodes 315 and 325 integrally formed with each other extend to outside of the display area DA and are electrically connected to a conductive layer having a constant potential, i.e., an electrode power supply line. The first conductive layer 1CL and the second conductive layer 2CL may serve as the electrode power supply line electrically connected to the opposite electrodes 315 and 325 in the peripheral area PA.

In this case, the opposite electrodes 315 and 325 may directly contact the second conductive layer 2CL. Alternatively, the opposite electrodes 315 and 325 may contact a connection electrode, and the connection electrode may contact the second conductive layer 2CL. In this case, the connection electrode may include the same material as that included in the first and second pixel electrodes 311 and 321, and may contact an upper surface and the like of the second conductive layer 2CL via a through hole formed in the planarization layer 140 in the peripheral area PA. Alternatively, the connection electrode may include the same material as that included in the first and second pixel electrodes 311 and 321, and may contact an upper surface and the like of the second conductive layer 2CL exposed to outside of the planarization layer 140 in the peripheral area PA. The opposite electrodes 315 and 325 may contact an upper surface and the like of the connection electrode via a through hole formed in the pixel defining layer 150 in the peripheral area PA. Alternatively, the opposite electrodes 315 and 325 may contact an upper surface and the like of the connection electrode exposed to outside of the pixel defining layer 150 in the peripheral area PA.

Alternatively, the first conductive layer 1CL and the second conductive layer 2CL may be electrically connected to a power line. Power needs to be connected to the first pixel electrode 311 of the first display device 310 and the second pixel electrode 321 of the second display device 320, as described above, via the first and second thin film transistors 210 and 220. To this end, the power line may extend from the peripheral area PA to the display area DA.

The power line may include a first power line connected to the first conductive layer 1CL and extending to the display area DA, and a second power line connected to the second conductive layer 2CL and extending to the display area DA. For example, the first power line may be integrally formed with the first conductive layer 1CL, and the second power line may be integrally formed with the second conductive layer 2CL. In the display area DA, an insulating layer, such as the second interlayer insulating layer 132, may be interposed between the first power line and the second power line. However, through holes may be formed in the insulating layer at a plurality of points within the display area DA, and thus the first power line and the second power line may contact each other at the plurality of points within the display area DA. Of course, an intermediate conductive layer may be interposed between the first power line and the second power line, and thus the intermediate conductive layer may contact the first power line and the second power line may contact the intermediate conductive layer. Consequently, in the display area DA, the first power line and the second power line may be electrically connected to each other at the plurality of points. In any case, the second power line is electrically connected to the pixel electrodes 311 and 321 of the OLEDs. An example of a detailed shape of the power line will be described later.

The description of the structure of electrical connection between the first conductive layer 1CL and the second conductive layer 2CL or the shape of the transmission window 500 given above with reference to FIG. 3 and/or FIG. 4 is applicable to the display apparatus according to the present embodiment. The display apparatus according to the present embodiment of FIG. 7 may be modified in various ways. For example, all features according to the embodiments described above with reference to FIG. 3 and/or FIG. 4 are equally applicable to the display apparatus of FIG. 7, except that the first conductive layer 1CL is located on the first interlayer insulating layer 131 and the second conductive layer 2CL is located on the second interlayer insulating layer 132. A structure in which the plurality of wirings PL include the plurality of first wirings PL1 and the plurality of second wirings PL2 and the plurality of first wirings PL1 and the plurality of second wirings PL2 are located on different layers, as described above with reference to FIG. 5 and/or FIG. 6, is equally applicable to the display apparatus of FIG. 7.

Referring to FIG. 7, the first source electrode 215a and the first drain electrode 215b are on a different layer from a layer on which the second source electrode 225a and the second drain electrode 225b are located. However, the disclosure in not limited thereto. In another embodiment, the second source electrode 225a and the second drain electrode 225b may be located on the first interlayer insulating layer 131, similar to the first source electrode 215a and the first drain electrode 215b, and a conductive layer may be located on the second interlayer insulating layer 132 in order to serve as a line or a connection layer. In this case, the first conductive layer 1CL may be located on the first interlayer insulating layer 131, similar to the first source electrode 215a, the first drain electrode 215b, the second source electrode 225a, and the second drain electrode 225b, and the second conductive layer 2CL may be located on the second interlayer insulating layer 132, similar to the conductive layer used to serve as a line or a connection layer in the display area DA. In other words, even in this case, the same structure as shown in FIG. 7 may be used in the peripheral area PA.

Figure 8:
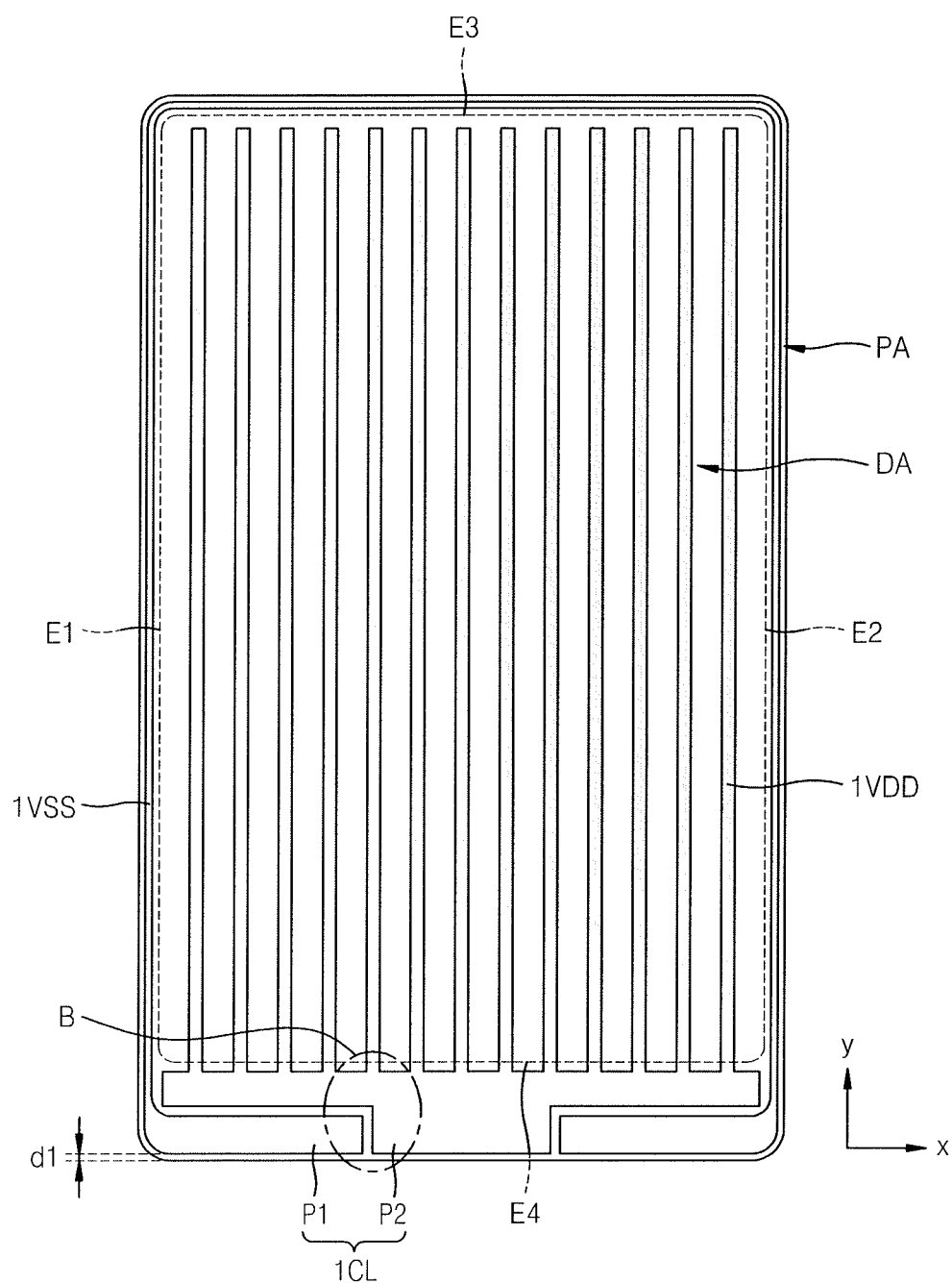
FIGS. 8 and 9 illustrate plan views of a portion of a display apparatus according to another embodiment.
Figure 9:
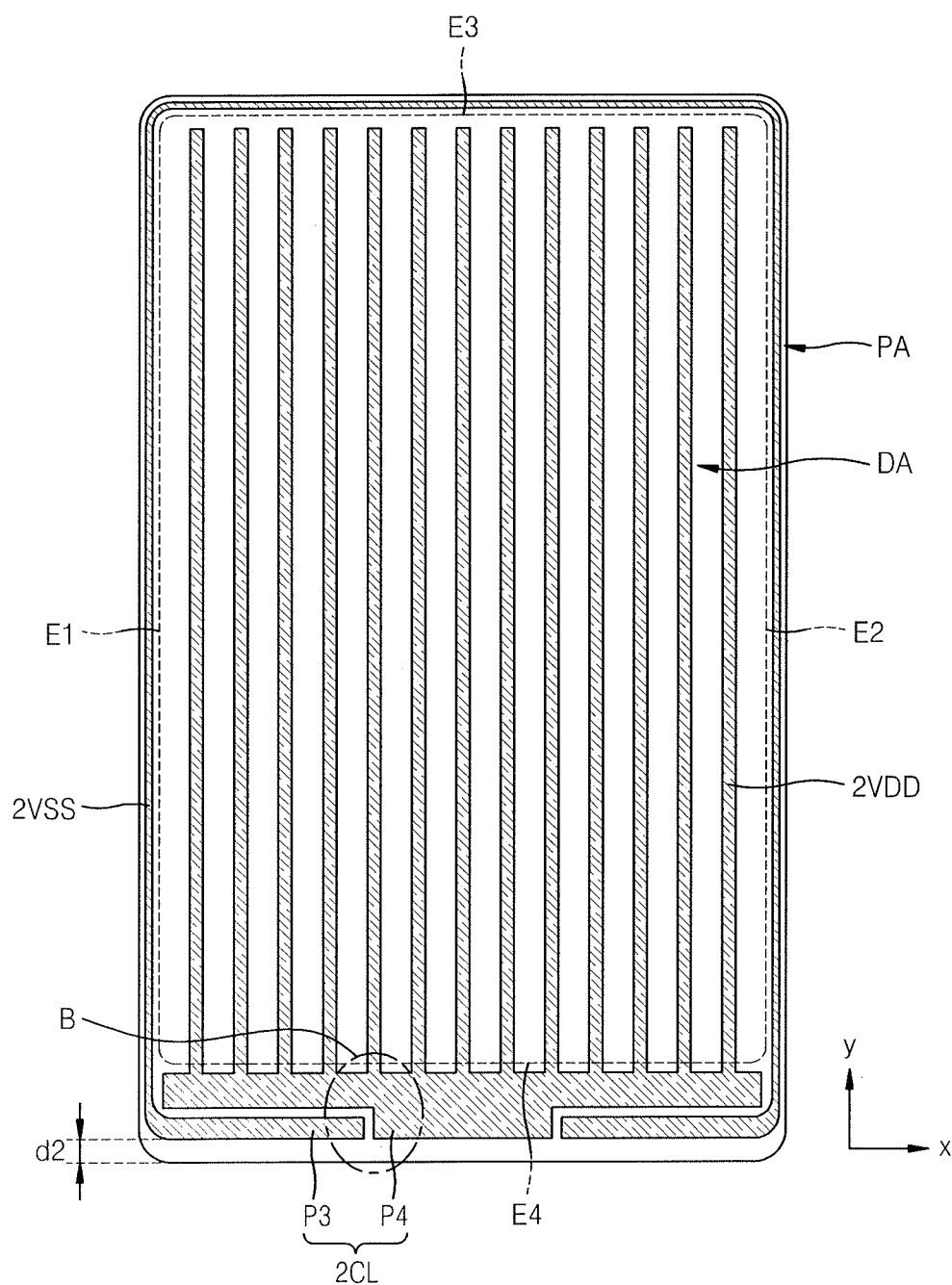
Figure 10:
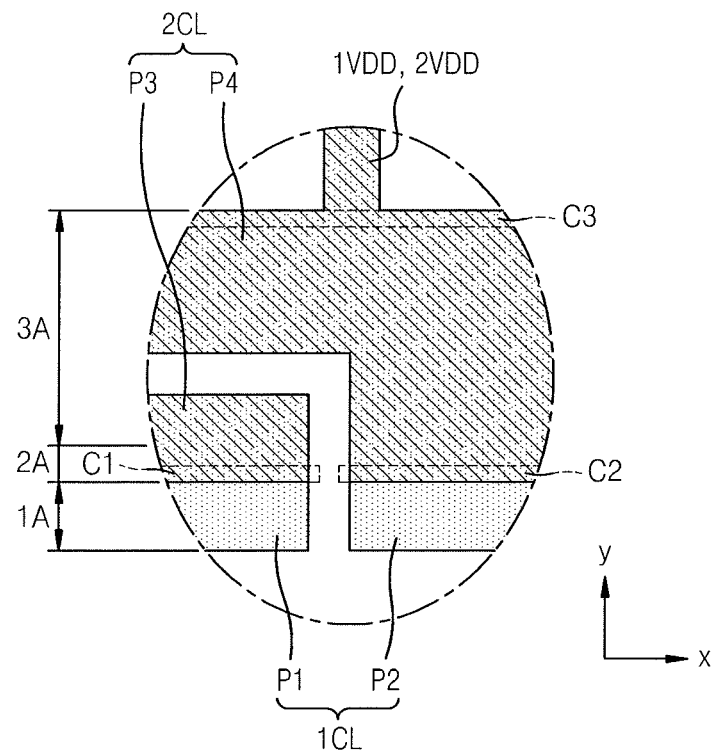
FIG. 10 illustrates a conceptual view of portions B of FIGS. 8 and 9.

FIGS. 8 and 9 are plan views of a portion of a display apparatus according to another embodiment. FIG. 8 schematically illustrates a shape of a first conductive layer 1CL in a top view, and FIG. 9 schematically illustrates a shape of a second conductive layer 2CL in a top view. FIG. 10 is a schematic conceptual view of portions B of FIGS. 8 and 9, and may be understood as a plan view illustrating both the first conductive layer 1CL and the second conductive layer 2CL. For reference, a description given below with reference to FIGS. 8 through 10 is equally applicable to the embodiment described above with reference to FIGS. 3 and 4, the embodiment described above with reference to FIGS. 5 and 6, or the embodiment described above with reference to FIG. 7.

Referring to FIG. 8, the first conductive layer 1CL included in the display apparatus according to the present embodiment has a first conductive part P1 and a second conductive part P2 spaced apart from each other. For convenience sake, FIG. 8 does not illustrate a plurality of wirings. However, the display apparatus according to the present embodiment includes the plurality of wirings PL as shown in FIGS. 1 and 2. Accordingly, a first interlayer insulating layer (see 131 of FIG. 3, 5, or 7) covering the plurality of wirings PL includes a first upper surface having a first uneven surface corresponding to the plurality of wirings PL. Thus, each of the first conductive part P1 and the second conductive part P2 on the first interlayer insulating layer includes a second upper surface having a second uneven surface corresponding to the first uneven surface.

The second conductive part P2 is located between the fourth edge E4 of the display area DA and the pad area PADA of FIGS. 1 and 2, and, as shown in FIG. 8, includes a narrow portion adjacent to an outermost edge of the substrate and a wide portion adjacent to the fourth edge E4 of the display area DA. The first conductive parts P1 may be located on one side (in a −x direction) and the other side (in a +x direction) of the narrow portion of the second conductive part P2, respectively, e.g., the narrow portion of the second conductive part P2 may be between the first conductive parts P1 along the x direction.

In the embodiments of FIGS. 3 through 6, the second conductive layer 2CL is located on the planarization layer 140. In the embodiment of FIG. 7, the second conductive layer 2CL is located on the second interlayer insulating layer 132, because the second interlayer insulating layer 132 may be understood as a planarization layer in the case of FIG. 7. For convenience of explanation, the second conductive layer 2CL will now be described as being located on a planarization layer. At least a portion of the second conductive layer 2CL is located on the planarization layer, and, as shown in FIG. 9, the second conductive layer 2CL includes a third conductive part P3 and a fourth conductive part P4 spaced apart from each other.

The fourth conductive part P4 is located between the fourth edge E4 of the display area DA and the pad area PADA of FIGS. 1 and 2, and, as shown in FIG. 9, includes a narrow portion adjacent to an edge of a substrate and a wide portion adjacent to the fourth edge E4 of the display area DA. The third conductive parts P3 may be located on one side (in the −x direction) and the other side (in the +x direction) of the narrow portion of the fourth conductive part P4, respectively. The third conductive part P3 is electrically connected to the first conductive part P1 in a second area 2A, and the fourth conductive part P4 is electrically connected to the second conductive part P2 in the second area 2A.

In FIG. 10, the third conductive part P3 is electrically connected to the first conductive part P1 in a portion C1 of the second area 2A, and the fourth conductive part P4 is electrically connected to the second conductive part P2 in a portion C2 of the second area 2A. As shown in FIG. 10, the fourth conductive part P4 and the second conductive part P2 may also be electrically connected to each other in a portion C3 of the third area 3A. In detail, an end of the fourth conductive part P4 in the direction toward the display area DA may be electrically connected to an end of the second conductive part P2 in the direction toward the display area DA. Consequently, the planarization layer between the first conductive layer 1CL and the second conductive layer 2CL may be located in a portion of an overlapping area between the first conductive layer 1CL and the second conductive layer 2CL except for the portions C1, C2, and C3, e.g.

An end of the first conductive part P1 in the direction facing away from the display area DA (in the −y direction) is farther from the display area DA than an end of the third conductive part P3 in the direction facing away from the display area DA (in the −y direction). Accordingly, a distance d1 between the end of the first conductive part P1 in the direction facing away from the display area DA (in the −y direction) and an edge of the substrate, as shown in FIG. 8, is smaller than a distance d2 between the end of the third conductive part P3 in the direction facing away from the display area DA (in the −y direction) and the edge of the substrate, as shown in FIG. 9. Consequently, as viewed in a direction approximately perpendicular to the substrate, a portion of the first conductive part P1 is located outside of the third conductive part P3, e.g., en edge of the first conductive part P1 extends beyond the third conductive part P3 in a top view (FIG. 10). An end of the second conductive part P2 in the direction facing away from the display area DA (in the −y direction) is farther from the display area DA than an end of the fourth conductive part P4 in the direction facing away from the display area DA (in the −y direction). Accordingly, as viewed in the direction approximately perpendicular to the substrate, a portion of the second conductive part P2 is located outside of the fourth conductive part P4, e.g., en edge of the second conductive part P2 extends beyond the fourth conductive part P4 in a top view (FIG. 10).

In the case of the transmission window 500 described above with reference to FIGS. 3 through 7, the blocking area may shield the portion of the first conductive part P1 located outside of the end of the third conductive part P3 and the portion of the second conductive part P2 located outside of the end of the fourth conductive part P4.

As shown in FIG. 8, a first power line 1VDD is connected to the second conductive part P2 of the first conductive layer 1CL and extends to the display area DA. As shown in FIG. 9, a second power line 2VDD is connected to the fourth conductive part P4 of the second conductive layer 2CL and extends to the display area DA. As described above, the first power line 1VDD and the second power line 2VDD are electrically connected to each other at a plurality of points in the display area DA. The first power line 1VDD may be integrally formed with the second conductive part P2 of the first conductive layer 1CL, and the second power line 2VDD may be integrally formed with the fourth conductive part P4 of the second conductive layer 2CL.

As described above, the first conductive part P1 and the third conductive part P3 may serve as an electrode power supply line. As shown in FIG. 8, the first conductive part P1 may be electrically connected to a first electrode power line 1VSS that approximately travels around the display area DA. As shown in FIG. 9, the third conductive part P3 may be electrically connected to a second electrode power line 2VSS that approximately travels around the display area DA. The first conductive part P1 and the first electrode power line 1VSS may be integrally formed with each other, and the third conductive part P3 and the second electrode power line 2VSS may be integrally formed with each other. The first electrode power line 1VSS and the second electrode power line 2VSS may be electrically connected to each other at a plurality of points. Alternatively, the first electrode power line 1VSS and the second electrode power line 2VSS may continuously contact each other in an extending direction thereof. The opposite electrodes 315 and 325 integrally formed with each other in the display area DA may extend to outside of the display area DA and may directly contact the second electrode power line 2VSS. Alternatively, the opposite electrodes 315 and 325 may extend to outside of the display area DA and contact a connection electrode being a conductive layer, and the connection electrode may contact the second electrode power line 2VSS.

Figure 11:
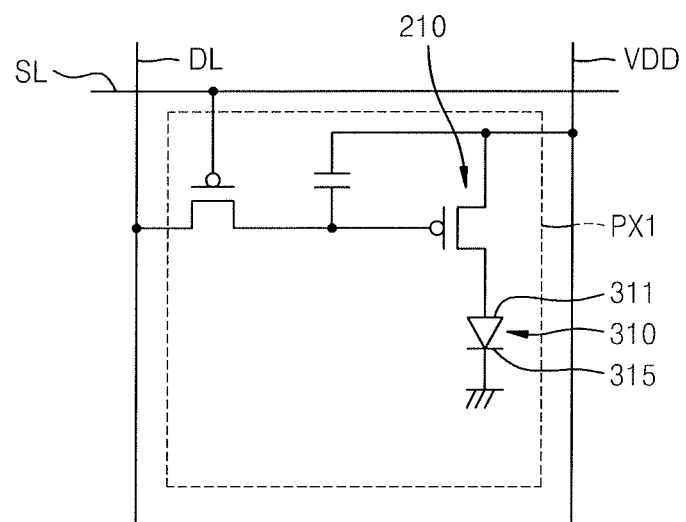
FIG. 11 illustrates a circuit diagram of a pixel of a display apparatus according to another embodiment.

FIG. 11 is a circuit diagram of one pixel of a display apparatus according to an embodiment. FIG. 11 illustrates a power supply line VDD, a data line DL approximately parallel to the power supply line VDD, and a scan line SL extending in a direction intersecting with the data line DL. Such a data line transmits a data signal to the first display device 310 and the like. The data signal is transmitted from an IC or a PCB located in the peripheral area PA to the data line via a plurality of wirings PL. The data line DL may be integrally formed with the plurality of wirings PL. Alternatively, the data line DL may be on a different layer from a layer on which the plurality of wirings PL are located, but may be electrically connected to the plurality of wirings PL via a contact hole or the like.

The scan line SL simultaneously applies a scan signal to a plurality of display devices located on the same row. The scan signal may be generated in a driving circuit unit located in the peripheral area PA around the display area DA. The driving circuit unit may include, for example, a shift register. The plurality of wirings PL according to the above-described embodiments may be electrically connected to the driving circuit unit. In other words, the plurality of wirings PL may transmit an electrical signal from an IC or a PCB located in the peripheral area PA to the driving circuit unit, and the driving circuit unit may generate an electrical signal that is to be applied to the display area DA.

It has been described above with reference to FIGS. 1 and 2 that the plurality of wirings PL extend obliquely with respect to the y axis in the first area 1A, are bent at the boundary between the first area 1A and the second area 2A, extend parallel to the y axis, are bent again at the boundary between the second area 2A and the third area 3A, and extend obliquely with respect to the y axis. However, the display apparatus according to the present embodiment is not limited thereto. In other words, as long as an interval between the plurality of wirings PL in the second area 2A is greater than an interval between the plurality of wirings PL in the first area 1A and an interval between the plurality of wirings PL in the third area 3A, the extending direction of the plurality of wirings PL may be variously modified.

Figure 12:
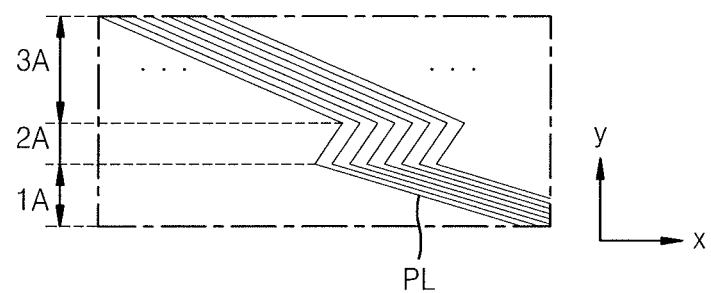
FIG. 12 illustrates a schematic conceptual view of a portion of a display apparatus according to another embodiment.
Figure 13:
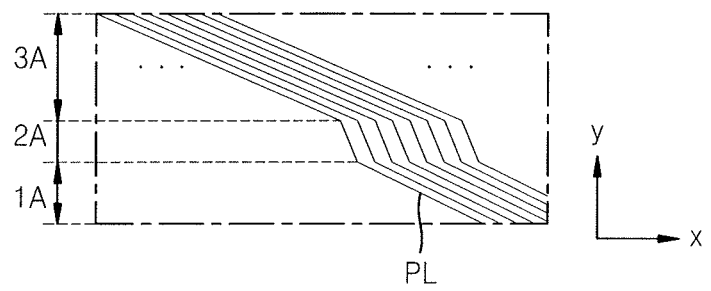
FIG. 13 illustrates a schematic conceptual view of a portion of a display apparatus according to another embodiment.

FIG. 12 illustrates a schematic conceptual view of a portion of a display apparatus according to another embodiment. In the embodiment of FIG. 12, the plurality of wirings PL extend obliquely with respect to the y axis in the first area 1A, are bent at the boundary between the first area 1A and the second area 2A, extend obliquely with respect to the y axis in a direction opposite the extending direction in the first area 1A in the x-axis direction, are bent again at the boundary between the second area 2A and the third area 3A, and extend in the same direction as the extending direction in the first area 1A. Alternatively, as shown in FIG. 13, which is a schematic conceptual view of a portion of a display apparatus according to another embodiment, the plurality of wirings PL extend obliquely with respect to the y axis in the first area 1A, are bent at the boundary between the first area 1A and the second area 2A, extend obliquely with respect to the y axis in an oblique direction identical with the oblique direction in the first area 1A when viewed in the x-axis direction, are bent again at the boundary between the second area 2A and the third area 3A, and extend in the same direction as the extending direction in the first area 1A. In any case, the extending direction of the plurality of wirings PL in the first area 1A may be approximately identical with that of the plurality of wirings PL in the third area 3A.

Figure 14:
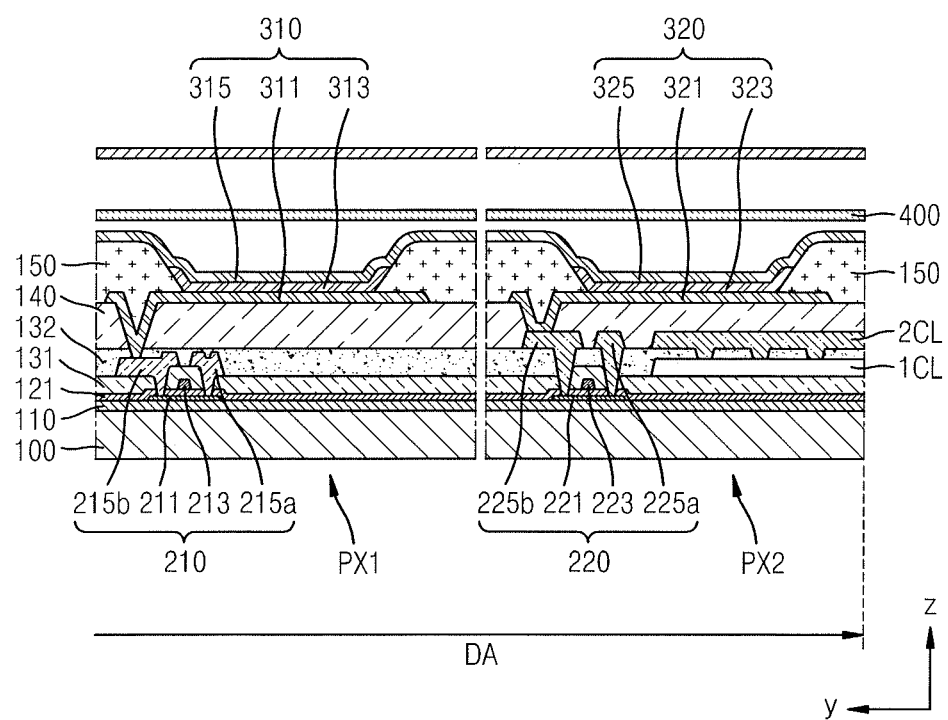
FIG. 14 illustrates a cross-sectional view of a portion of a display apparatus according to another embodiments.

As described above, the power line may include a first power line connected to the first conductive layer 1CL and extending to the display area DA, and a second power line connected to the second conductive layer 2CL and extending to the display area DA. For example, as shown in FIG. 14, the first power line may be integrally formed with the first conductive layer 1CL, and the second power line may be integrally formed with the second conductive layer 2CL. In the display area DA, an insulating layer, such as the second interlayer insulating layer 132, may be interposed between the first power line and the second power line. However, through holes may be formed in insulating layer such as the interlayer insulating layer 132 at a plurality of points within the display area DA, and thus the first power line and the second power line may contact each other at the plurality of points within the display area DA. Of course, an intermediate conductive layer may be interposed between the first power line and the second power line, and thus the intermediate conductive layer may contact the first power line and the second power line may contact the intermediate conductive layer. Consequently, in the display area DA, the first power line and the second power line may be electrically connected to each other at the plurality of points. In any case, the second power line is electrically connected to the pixel electrodes 311 and 321 of the OLEDs through electronic elements such as the first and second thin film transistors 210 and 220.

By way of summation and review, external light may be reflected from lines and/or circuits outside the display area, e.g., from the peripheral area, thereby causing quality degradation of an image displayed in the display area to a user. In contrast, one or more embodiments include a display apparatus capable of preventing image quality degradation caused by external light.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A display apparatus, comprising:
  a substrate having a display area and a peripheral area outside the display area;

a plurality of wirings over the peripheral area of the substrate, the plurality of wirings extending from a first area to a third area via a second area;

an interlayer insulating layer covering the plurality of wirings, the interlayer insulating layer having a first uneven upper surface corresponding to the plurality of wirings;

a first conductive layer over the interlayer insulating layer and including a second uneven upper surface corresponding to the first uneven upper surface;

a planarization layer over the first conductive layer and exposing at least a portion of the first conductive layer in the second area, the planarization layer having an upper surface that is flat and overlaps the second uneven upper surface in plan view;

a second conductive layer electrically connected to the first conductive layer in the second area, at least a portion of the second conductive layer being over the planarization layer; and a polarization plate on the second conductive layer so as to overlap the plurality of wirings in the peripheral area in plan view.

2. The display apparatus as claimed in claim 1, wherein the plurality of wirings include a plurality of first wirings and a plurality of second wirings.

3. The display apparatus as claimed in claim 2, wherein the plurality of first wirings alternate with the plurality of second wirings.

4. The display apparatus as claimed in claim 2, further comprising:
a first gate insulating layer below the plurality of first wirings; and
a second gate insulating layer below the interlayer insulating layer and covering the plurality of first wirings, wherein
the plurality of second wirings are on the second gate insulating layer and correspond to spaces between the plurality of first wirings.

5. The display apparatus as claimed in claim 1, further comprising:
a light-emitting device on the display area of the substrate, the light-emitting device including a pixel electrode, an intermediate layer, and an opposite electrode that are sequentially stacked, wherein
the intermediate layer includes an emission layer, and
the opposite electrode extends to the peripheral area and is electrically connected to the second conductive layer.

6. The display apparatus as claimed in claim 5, wherein the opposite electrode is in contact with a connection electrode that includes same material as the pixel electrode and is in contact with the second conductive layer.

7. The display apparatus as claimed in claim 1, further comprising:
a first power line connected to the first conductive layer and extending to the display area; and
a second power line connected to the second conductive layer and extending to the display area.

8. The display apparatus as claimed in claim 7, wherein the first power line is electrically connected to the second power line at a plurality of points.

9. The display apparatus as claimed in claim 7, further comprising:
a light-emitting device on the display area of the substrate, the light-emitting device including a pixel electrode, an intermediate layer that includes an emission layer, and an opposite electrode that are sequentially stacked, wherein the second power line is electrically connected to the pixel electrode of the light-emitting device.

10. The display apparatus as claimed in claim 1, wherein:
the first conductive layer has a first end in a direction facing away from the display area,
the second conductive layer has a second end in the direction facing away from the display area, and
the first end is farther from the display area than the second end.

11. The display apparatus as claimed in claim 10, further comprising a transmission window over the polarization plate, the transmission window including;
a transmission area that corresponds to the display area and transmits light, and
a blocking area that is outside the transmission area and blocks light, a portion of the first conductive layer that is outside the second end being shielded by the blocking area.

12. The display apparatus as claimed in claim 10, further comprising a transmission window over the polarization plate, the transmission window including:
a transmission area that corresponds to the display area and transmits light, and
a blocking area that is outside the transmission area and blocks light, wherein,
when viewed in a direction perpendicular to the substrate, a boundary between the transmission area and the blocking area is closer to the display area than the second end.

13. The display apparatus as claimed in claim 10, wherein the second end is positioned within the second area.

14. The display apparatus as claimed in claim 10, wherein the second end is positioned at a boundary between the first area and the second area.

15. The display apparatus as claimed in claim 1, wherein the plurality of wirings are bent at a boundary between the first area and the second area and bent at a boundary between the second area and the third area.

16. The display apparatus as claimed in claim 15, wherein an extending direction of the plurality of wirings in the first area is identical with an extending direction of the plurality of wirings in the third area.

17. The display apparatus as claimed in claim 15, wherein an extending direction of the plurality of wirings in the second area is perpendicular to the boundary between the first area and the second area.

18. The display apparatus as claimed in claim 1, wherein an end of the planarization layer in a direction toward the first area is positioned within the second area.

19. The display apparatus as claimed in claim 1, wherein an end of the planarization layer in a direction toward the first area is positioned at a boundary between the second area and the third area.

20. The display apparatus as claimed in claim 1, wherein each wire of the plurality of wirings extends from the first area through the second and third areas of the non-display area into the display area.

21. The display apparatus as claimed in claim 1, wherein:
the first area, the second area, and the third area are all in the peripheral area,
each wire of the plurality of wirings extends from the third area to the first area via the second area, and
an interval between the plurality of wirings in the second area is greater than an interval between the plurality of wirings in each of the first area and the third area as seen in plan view.

22. A display apparatus, comprising:
a substrate having a display area and a peripheral area outside the display area;
a plurality of wirings over the peripheral area of the substrate, the plurality of wirings extending from a first area to a third area via a second area;
an interlayer insulating layer covering the plurality of wirings and including a first uneven surface corresponding to the plurality of wirings;
a first conductive layer over the interlayer insulating layer, the first conductive layer having a second uneven surface corresponding to the first uneven surface, and including a first conductive part and a second conductive part spaced apart from each other;
a planarization layer over the first conductive layer and exposing at least a portion of each of the first conductive part and the second conductive part of the first conductive layer in the second area, the planarization layer having an upper surface that is flat overlaps the second uneven upper surface in plan view;
a second conductive layer including a third conductive part electrically connected to the first conductive part in the second area, and a fourth conductive part spaced apart from the third conductive part and electrically connected to the second conductive part in the second area, wherein at least a portion of the second conductive layer is over the planarization layer; and
a polarization plate over the second conductive layer so as to overlap the plurality of wirings in the peripheral area in plan view.

23. The display apparatus as claimed in claim 22, wherein:
the first conductive part has an end in a direction facing away from the display area and the third conductive part has an end in the direction facing away from the display area, and the end of the first conductive part is farther from the display area than the end of the third conductive layer,
the second conductive part has an end in the direction facing away from the display area and the fourth conductive part has an end in the direction facing away from the display area, and the end of the second conductive part is farther from the display area than the end of the fourth conductive layer, and
the display apparatus further includes a transmission window over the polarization plate and including a transmission area that corresponds to the display area and transmits light and a blocking area that is outside the transmission area and blocks light, wherein a portion of the first conductive part that is outside the end of the third conductive part and a portion of the second conductive part that is outside the end of the fourth conductive part are shielded by the blocking area.

24. The display apparatus as claimed in claim 22, wherein each wire of the plurality of wirings extends from the first area through the second and third areas of the non-display area into the display area.

25. The display apparatus as claimed in claim 22, wherein:
the first area, the second area, and the third area are all in the peripheral area,
each wire of the plurality of wirings extends from the third area to the first area via the second area, and
an interval between the plurality of wirings in the second area is greater than an interval between the plurality of wirings in each of the first area and the third area as seen in plan view.

* * * * *